United States Patent [19]

Huang

[11] Patent Number: 5,121,014
[45] Date of Patent: Jun. 9, 1992

[54] CMOS DELAY CIRCUIT WITH CONTROLLABLE DELAY

[75] Inventor: Eddy C. Huang, San Jose, Calif.

[73] Assignee: VLSI Technology, Inc., San Jose, Calif.

[21] Appl. No.: 665,377

[22] Filed: Mar. 5, 1991

[51] Int. Cl.$^5$ .................... H03K 5/13; H03K 19/091
[52] U.S. Cl. ............................... 307/605; 307/606; 328/55
[58] Field of Search ............ 307/605, 601, 606, 594; 328/55

[56] References Cited

U.S. PATENT DOCUMENTS

| 4,947,064 | 8/1990 | Kim et al. | 307/605 |
| 5,012,141 | 4/1991 | Tomisawa | 307/594 |
| 5,012,142 | 4/1991 | Sonntag | 307/605 |

FOREIGN PATENT DOCUMENTS

| 171022A2 | 2/1986 | European Pat. Off. | 307/605 |
| 1-413124 | 2/1989 | Japan | 307/605 |

OTHER PUBLICATIONS

IBM Technical Disclosure Bulletin, vol. 31, No. 1, Jun. 1988 pp. 21-23.

*Primary Examiner*—Eugene R. Laroche
*Assistant Examiner*—Tan Dinh
*Attorney, Agent, or Firm*—Flehr, Hohbach, Test, Albritton & Herbert

[57] ABSTRACT

A variable delay circuit consists of a single-stage CMOS delay circuit having an associated time delay between its input and output. A first transistor connects a voltage supply node to other portions of the single-stage CMOS delay circuit. The impedance of the first transistor corresponds to an associated time delay. A second transistor, gated by a control signal, connects the voltage supply node and the other portions of the single-stage CMOS delay circuit in parallel with the first P-channel transistor. The delay circuit delays signals for a longer period of time when the second transistor is disabled by said control signal than when the second transistor is enabled. In a variation on this delay circuit, a plurality of delay control elements are coupled to the single-stage delay circuit, each accepting a distinct control signal and decreasing the delay circuits associated time delay to a corresponding shorter delay time when its control signal is enabled. This delay circuit delays signals by a multiplicity of distinct delay times in accordance with the control signals. Further variability in the delay time can be achieved by cascading a plurality of delay stages, with two or more of the said cascaded delay stages comprising a variable delay circuit with a delay time that is governed by one or more control signals. A multiplicity of different delay times can be selected via the control signals for the various variable delay stages.

9 Claims, 1 Drawing Sheet

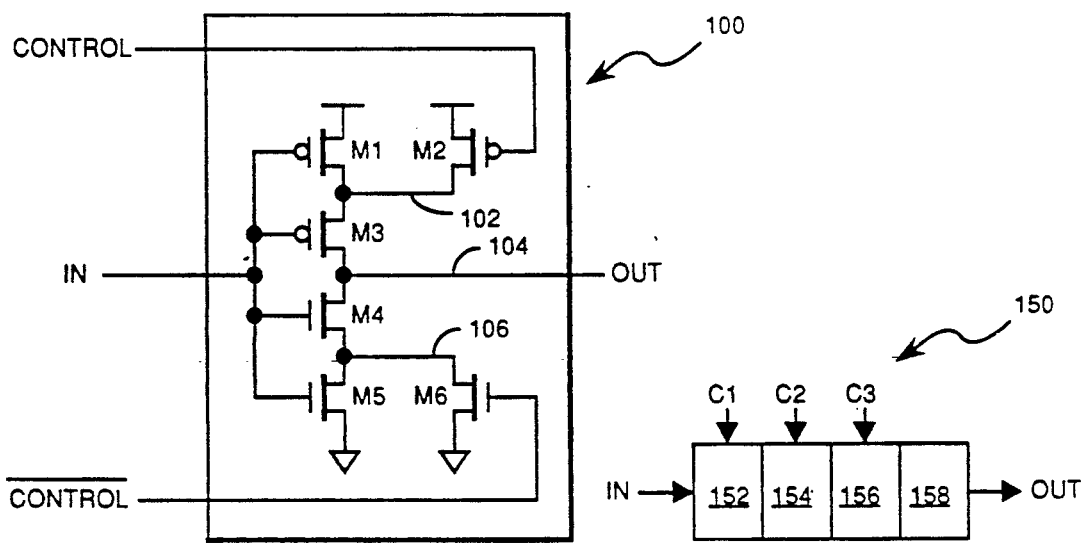
FIGURE 1          FIGURE 3
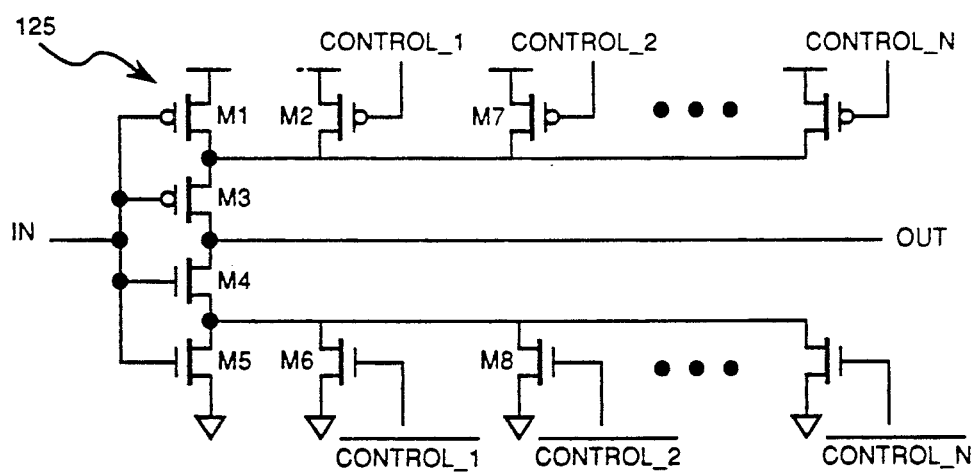
FIGURE 2
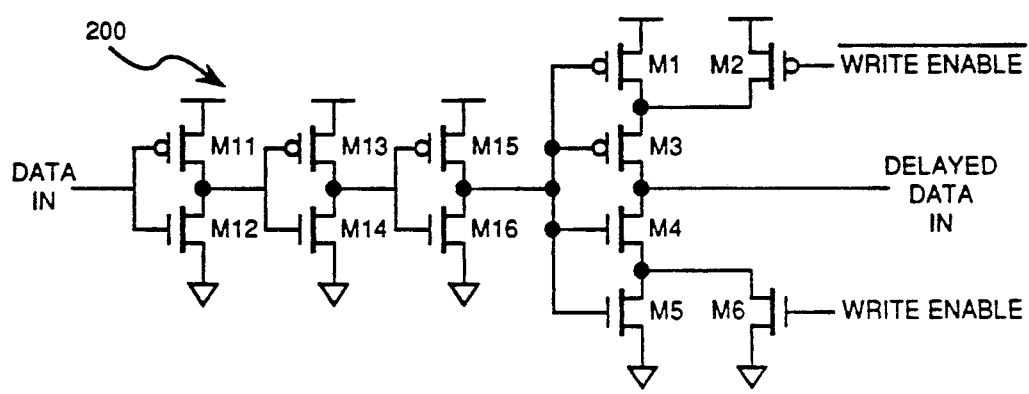
FIGURE 4

CMOS DELAY CIRCUIT WITH CONTROLLABLE DELAY

The present invention relates generally to delay circuits, and particularly to a delay circuit in which the amount of delay generated is determined by the setting of one or more control signals.

BACKGROUND OF THE INVENTION

Many integrated circuits require delay circuits in certain signal paths. For instance, it may be important to delay the arrival of a signal until a particular circuit has prepared itself for the signal's arrival. A signal may be also be delayed to ensure that the circuit meets certain timing specifications.

Conventional delay circuits produces a fixed amount of time delay, which may not be the optimal amount of delay under various conditions. In situations where different amounts of delay would be optimal in different conditions, conventional delay circuits are designed either for a time delay amount that is a compromise value for all conditions, or a time delay that is best for one condition and acceptable for other conditions.

It is therefore an object of the present invention to provide a delay circuit that creates different time delays under different conditions.

SUMMARY OF THE INVENTION

In summary, the present invention is a variable delay circuit consisting of a single-stage CMOS delay circuit having an associated time delay between its input and output. A first transistor connects a voltage supply node to other portions of the single-stage CMOS delay circuit. The impedance of the first transistor corresponds to an associated time delay. A second transistor, gated by a control signal, connects the voltage supply node and the other portions of the single-stage CMOS delay circuit in parallel with the first P-channel transistor. The delay circuit delays signals for a longer period of time when the second transistor is disabled by said control signal than when the second transistor is enabled.

In a variation on this delay circuit, a plurality of delay control elements are coupled to the single-stage delay circuit, each accepting a distinct control signal and decreasing the delay circuits associated time delay to a corresponding shorter delay time when its control signal is enabled. This delay circuit delays signals by a multiplicity of distinct delay times in accordance with the control signals.

Further variability in the delay time can be achieved by cascading a plurality of delay stages, with two or more of the said cascaded delay stages comprising a variable delay circuit with a delay time that is governed by one or more control signals. A multiplicity of different delay times can be selected via the control signals for the various variable delay stages.

BRIEF DESCRIPTION OF THE DRAWINGS

Additional objects and features of the invention will be more readily apparent from the following detailed description and appended claims when taken in conjunction with the drawings, in which:

FIG. 1 is a circuit schematic of a CMOS variable delay circuit which produces two different time delays in accordance with the value of a control signal.

FIG. 2 is a circuit schematic of a CMOS variable delay circuit which produces several different time delays in accordance with the value of several control signals.

FIG. 3 is a block diagram of a delay circuit with cascaded delay stages.

FIG. 4 is a circuit schematic of a CMOS variable delay circuit suitable for delaying the Date In path of an integrated circuit memory device.

DESCRIPTION OF THE PREFERRED EMBODIMENT

Referring to FIG. 1, there is shown a single stage CMOS delay circuit 100, having three P-channel transistors M1, M2 and M3, and three N-channel transistors M4, M5 and M6. Transistors M1, M3, M4 and M5, all gated by the input signal IN, comprise a normal CMOS inverter. The circuit's transistors are serially coupled between VDD, the high voltage power supply node (typically 5 volts) for the circuit and VSS, the low voltage power supply node (typically 0 volts). The drain of transistor M1 is coupled to the source of transistor M3 at internal node 102, the drains transistors M3 and M4 are coupled at output node 104, and the drain of transistor M5 is coupled to the source of transistor M4 at internal node 106.

Forgetting about transistors M2 and M6 for the moment, the delay time associated with this inverter is government by the impedances of the transistors M1, M3, M4 and M5. In accordance with the present invention, transistors M3 and M4 will typically be fast devices with low impedance, while the M1 and M5 will be higher impedance devices that effective control the speed of the inverter. Thus, when transistors M2 and M6 are disabled, the delay time of the circuit 100 is governed primarily by transistors M1 and M5.

Transistors M2 and M6 are connected in parallel with transistors M1 and M5, respectively, and are gated by complementary control signals CONTROL and $\overline{\text{CONTROL}}$. Transistors M2 and M6 generally are much faster, lower impedance transistors than M1 and M5, with the exact impedances being selected so as to achieve a particular delay time when transistors M2 and M6 are enabled. When CONTROL=High, transistors M2 and M6 are disabled or off, and the delay circuit's delay time is governed by transistors M1 and M5. When CONTROL=Low, transistors M2 and M6 are enabled, and the delay circuit's delay time is governed by transistors M2 and M6.

More specifically, when CONTROL=Low, the delay time of the circuit 100 is shorter than when CONTROL=High. A typical pair of delay times for circuit 100 might be 1 nanosecond and 3 nanoseconds. The exact values of the two different delay times will depend on the particular sizes of the circuit's transistors. Delay times for a typical CMOS circuit 100 when CONTROL=Low can be, using current technology, as low as about 0.5 nanoseconds and as high as perhaps 5 nanoseconds or more. It is hard to put an upper limit on delay times when CONTROL=High, but a practical limit may be 50 nanoseconds or so. When even longer delays are needed, this will typically be achieved by cascading several delay stages, as will be discussed below with respect to FIG. 3.

FIG. 2 shows a single-stage delay circuit 125 which is similar to that shown in FIG. 1, except that this circuit has N pairs of delay control elements connected in parallel with transistors M1 and M5. Each pair of delay control element accepts a distinct pair of complementary control signals CONTROL_X and CON- TROL_X. Each pair of delay control elements has its own distinct impedance. Assuming that only one pair of complementary control signals is enabled at any one time, the circuit 125 will have N+1 distinct and selectable delay times, with the impedance of each such pair of control elements determining the time delay of the circuit when its control signal is enabled.

Alternately, all or several of the pairs or control elements could have identical impedances, with the delay of the circuit 125 being determined by the number of control signals which are enabled.

FIG. 3 shows a delay circuit 150 having several cascaded delay stages 152-158. Some of the stages of such a circuit, such as stage 158 have a fixed time delay while others have a variable delay controlled by a control signal C1, C2, C3. Using such a cascaded circuit provides an alternate mechanism for forming a delay circuit with multiple delay time values. It is also useful when the delay times needed are too long to be easily achieved with just a single stage delay circuit.

FIG. 4 shows an example of a delay circuit 200 suitable for use in an integrated memory circuit. It has three simple inverter delay stages M11-M12, M13-M14 and M15-M16 followed by a variable delay stage. This delay circuit 200 is used to delay the DATA IN signal to meet the memory device's DATA SETUP TIME and DATA HOLD TIME specifications. Prior art delay circuits for such memory devices have a single associated delay time that is a compromise between these two timing specifications. In practice, the delay is preferred to be short when the WRITE ENABLE signal is asserted, and the delay is preferred to be long when the WRITE ENABLE signal is disabled. The following is a table of device sizes (given in terms of channel width and channel length) for one example this circuit:

TABLE

EXAMPLE OF DEVICE SIZES FOR FIG. 4

| DEVICE | CHANNEL WIDTH/ CHANNEL LENGTH (MICRONS) |
| --- | --- |
| M1 | 5μ/10μ |
| M2 | 40μ/1μ |
| M3 | 20μ/1μ |
| M4 | 10μ/1μ |
| M5 | 5μ/10μ |
| M6 | 20μ/1μ |
| M11 | 20μ/1μ |
| M12 | 10μ/1μ |
| M13 | 20μ/1μ |
| M14 | 10μ/1μ |
| M15 | 20μ/1μ |
| M16 | 10μ/1μ |

Using these device sizes, the last stage of circuit 200 has a fast delay time of about 1 nanosecond, when WRITE ENABLE is high, and a slow delay time of about 3 nanoseconds when WRITE ENABLE is low. These delay times can be changed by changing the transistor sizes.

While the present invention has been described with reference to a few specific embodiments, the description is illustrative of the invention and is not to be construed as limiting the invention. Various modifications may occur to those skilled in the art without departing from the true spirit and scope of the invention as defined by the appended claims.

What is claimed is:

1. A variable delay circuit, comprising:

a high voltage source node, and a low voltage source node;

a CMOS inverter having first and second P-channel transistors and first and second N-channel transistors, all with gates coupled to an input signal node, said first P-channel transistor having a source coupled to said high voltage node and a drain coupled to a first intermediate node, said second P-channel transistor having a source coupled to said first intermediate node and a drain coupled to an output node, said first N-channel transistor having a source coupled to said low voltage source node and a drain coupled to a second intermediate node, said second N-channel transistor having a source coupled to said second intermediate node and a drain coupled to said output node; and a pair of control transistors, gated by complementary control signals, including a third P-channel transistor connected to said high voltage source node and said first intermediate node in parallel with said first P-channel transistor, and a third N-channel transistor connected to said low voltage source node and said second intermediate node in parallel with said first N-channel transistor;

wherein said delay circuit delays signals for a longer period of time when said pair of control transistors are disabled by said complementary control signals than when said pair of control transistors are enabled, whereby input signals on said input signal node are delayed by two distinct delay times in accordance with said complementary control signals.

2. A variable delay circuit, comprising:

a high voltage source node, and a low voltage source node;

a CMOS inverter having an associated time delay between its input and output; said CMOS inverter having first and second P-channel transistors and first and second N-channel transistors, all with gates coupled to an input signal node, said first P-channel transistor having a source coupled to said high voltage node and a drain coupled to a first intermediate note, said second P-channel transistor having a source coupled to said first intermediate node and a drain coupled to an output node, said first N-channel transistor having a source coupled to said low voltage source node and a drain coupled to a second intermediate node, said second N-channel transistor having a source coupled to said second intermediate node and a drain coupled to said output node; and a control transistor, gated by a control signal, including a third P-channel transistor connected to said high voltage source node and said first intermediate node in parallel with said first P-channel transistor;

wherein said delay circuit delays signals for a longer period of time when said control transistor is disabled by said control signal than when said control transistor is enabled, whereby input signals on said input signal node are delayed by two distinct delay times in accordance with said control signal.

3. A variable delay circuit, comprising:

a high voltage source node, and a low voltage source node;

a CMOS inverter having an associated time delay between its input and output; said CMOS inverter having first and second P-channel transistors and first and second N-channel transistors, all with gates coupled to an input signal node, said first P-channel transistors having a source coupled to said high voltage node and a drain coupled to a first intermediate node, said second P-channel transistor having a source coupled to said first intermediate node and a drain coupled to an output node, said first N-channel transistor having a source coupled to said low voltage source node and a drain coupled to a second intermediate node, said second N-channel transistor having a source coupled to said second intermediate node and a drain coupled to said output node; and a control transistor, gated by a control signal, connected to said CMOS inverter in parallel with a selected one of said first P-channel transistor and said first N-channel transistor, said control transistor decreasing said CMOS inverter's associated time delay to a corresponding shorter delay time when said control signal is enabled;

wherein said delay circuit delays signals for a longer period of time when said control transistor is disabled by said control signal than when said control transistor is enabled, whereby input signals on said input signal node are delayed by two distinct delay times in accordance with said control signal.

4. A variable delay circuit, comprising:

a high voltage source node, and a low voltage source node;

a CMOS inverter having an associated time delay between its input and output; said CMOS inverter having first and second P-channel transistors and first and second N-channel transistors, all with gates coupled to an input signal node, said first P-channel transistor having a source coupled to said high voltage node and a drain coupled to a first intermediate node, said second P-channel transistor having a source coupled to said first intermediate node and a drain coupled to an output node, said first N-channel transistor having a source coupled to said low voltage source node and a drain coupled to a second intermediate node, said second N-channel transistor having a source coupled to said second intermediate node and a drain coupled to said output node; and a plurality of delay control elements, each said delay control element connected to said CMOS inverter in parallel with a selected one of said first P-channel transistor and said first N-channel transistor, each delay control element accepting a distinct control signal and decreasing said associated time delay to a corresponding shorter delay time when its control signal is enabled;

whereby input signals on said input signal node are delayed by distinct delay times in accordance with said control signals.

5. The variable delay circuit of claim 4.

each of said delay control elements comprising a control transistor gated by one of said control signals, wherein each control transistor may have a distinct impedance so as to produce a corresponding time delay.

6. The variable delay circuit of claim 4, said plurality of delay control elements comprising a first plurality of control transistors connected in parallel with said first P-channel transistor and gated by a corresponding ones of said distinct control signals, and a second plurality of control transistors connected in parallel with said first N-channel transistor and gated by a plurality of complementary control signals comprising complements of said distance control signals;

wherein each control transistor may have a distinct impedance so as to produce a corresponding time delay.

7. A variable delay circuit, comprising:

a plurality of cascaded delay stages, wherein one of said cascaded delay stages comprises:

a high voltage source node, and a low voltage source node;

a CMOS inverter having an associated time delay between its input and output; said CMOS inverter having first and second P-channel transistors and first and second N-channel transistors, all with gates coupled to an input signal node, said first P-channel transistor having a source coupled to said high voltage node and a drain coupled to a first intermediate node, said second P-channel transistor having a source coupled to said first intermediate node and a drain coupoed to an output node, said first N-channel transistor having a source coupled to said low voltage source node and a drain coupled to a second intermediate node, said second N-channel transistor having a source coupled to said second intermediate node and drain coupled to said output node; and a control transistor, gated by a control signal, connected to said CMOS inverter in parallel with a selected one of said first P-channel transistor and said first N-channel transistor, said control transistor decreasing said CMOS inverter's associated time delay to a corresponding shorter delay time when said control signal is enabled;

wherein said delay circuit delays signals for a longer period of time when said control transistor is disabled by said control signal than when said control transistor is enabled, whereby input signals on said input signal node are delayed by two distinct dalay times in accordance with said control signal.

8. The variable delay circuit of claim 7, wherein said control transistor comprises a third P-channel transistor gated by said control signal and connected in parallel with said first P-channel transistor;

said variable delay circuit further including a third N-channel transistor connected in parallel with said first N-channel transistor and gated by a second control signal.

9. The variable delay circuit of claim 7, further including:

one or more additional delay control elements, each said additional delay control element connected to said CMOS inverter in parallel with a selected one of said first P-channel transistor and said first N-channel transistor, each said additional delay control element accepting a distinct control signal and decreasing said associated time delay to a corresponding shorter delay time when its control signal is enabled;

whereby input signals on said input signal node are delayed by distinct delay times in accordance with said control signals.

* * * * *